United States Patent
Chang et al.

(10) Patent No.: US 9,074,823 B2
(45) Date of Patent: Jul. 7, 2015

(54) THERMAL SIPHON STRUCTURE

(75) Inventors: Shyy-Woei Chang, Sinjhuang (TW); Kuei-Feng Chiang, Sinijhuang (TW)

(73) Assignee: Asia Vital Components Co., Ltd., Sinjhuang (TW)

( * ) Notice: Subject to any disclaimer, the term of this patent is extended or adjusted under 35 U.S.C. 154(b) by 370 days.

(21) Appl. No.: 12/857,511

(22) Filed: Aug. 16, 2010

(65) Prior Publication Data

US 2012/0018130 A1 Jan. 26, 2012

(30) Foreign Application Priority Data

Jul. 21, 2010 (TW) .................................. 099123951

(51) Int. Cl.
| | |
|---|---|
| F28D 15/00 | (2006.01) |
| F24H 3/00 | (2006.01) |
| F24H 9/02 | (2006.01) |
| F28D 15/02 | (2006.01) |
| F28F 3/04 | (2006.01) |
| H01L 23/427 | (2006.01) |

(52) U.S. Cl.
CPC ........ F28D 15/0233 (2013.01); F28D 15/0266 (2013.01); F28F 3/048 (2013.01); H01L 23/427 (2013.01); H01L 2924/0002 (2013.01)

(58) Field of Classification Search
CPC ............... F28F 225/00; F28D 15/0266; F28D 15/0233; F28D 15/043; F28D 15/046
USPC .......... 165/104.22, 104.19, 104.11, 128, 129, 165/130, 80.4, 104.26, 104.33
See application file for complete search history.

(56) References Cited

U.S. PATENT DOCUMENTS

| | | | | |
|---|---|---|---|---|
| 6,253,835 | B1 * | 7/2001 | Chu et al. ..................... | 165/80.4 |
| 6,437,981 | B1 * | 8/2002 | Newton et al. ................ | 361/700 |
| 6,719,040 | B2 * | 4/2004 | Sugito et al. ............. | 165/104.21 |
| 6,782,942 | B1 * | 8/2004 | Wang et al. .............. | 165/104.26 |
| 6,904,966 | B2 * | 6/2005 | Philpott et al. ................ | 165/185 |
| 6,951,243 | B2 * | 10/2005 | Nilson et al. ............. | 165/104.21 |
| 7,117,928 | B2 * | 10/2006 | Chen ............................ | 165/80.3 |
| 8,479,805 | B2 * | 7/2013 | Chang et al. ................. | 165/80.3 |
| 2006/0157227 | A1 * | 7/2006 | Choi et al. ............... | 165/104.21 |
| 2007/0227704 | A1 * | 10/2007 | Nagai et al. .............. | 165/104.33 |
| 2009/0114372 | A1 * | 5/2009 | Ippoushi et al. ......... | 165/104.14 |
| 2012/0018130 | A1 * | 1/2012 | Chang et al. ............. | 165/104.21 |
| 2012/0024499 | A1 * | 2/2012 | Chang et al. ............. | 165/104.25 |
| 2012/0227936 | A1 * | 9/2012 | Yang ......................... | 165/104.26 |
| 2015/0041103 | A1 * | 2/2015 | Kiley et al. .............. | 165/104.26 |

* cited by examiner

*Primary Examiner* — Allen Flanigan
*Assistant Examiner* — Claire Rojohn, III
(74) *Attorney, Agent, or Firm* — C. G. Mersereau; Nikolai & Mersereau, P.A.

(57) ABSTRACT

A thermal siphon structure includes a main body, a chamber disposed therein, an evaporation section, a condensation section and a connection section positioned between the evaporation section and condensation section. The evaporation section and condensation section are respectively arranged in the chamber on two sides thereof. The connection section has a set of first communication holes and a set of second communication holes in communication with the evaporation section and condensation section. The evaporation section and condensation section respectively have multiple first and second flow guide bodies, which are arranged at intervals to define therebetween first and second flow ways. Each of the first and second flow ways has a narrower end and a wider end. The first flow ways communicate with a free area. The condensation section is designed with a low-pressure end to create a pressure gradient for driving a working fluid to circulate without any capillary structure.

10 Claims, 11 Drawing Sheets

THERMAL SIPHON STRUCTURE

This application claims the priority benefit of Taiwan patent application number 099123951 filed on Jul. 21, 2010.

FIELD OF THE INVENTION

The present invention relates to an improved thermal siphon structure, and more particularly to a thermal siphon structure, which is able to drive a working fluid to circulate and transfer heat without any capillary structure. The thermal siphon structure is simplified and manufactured at much lower cost.

BACKGROUND OF THE INVENTION

Recently, following the rapid development of electronic semiconductor industries and the advance of manufacturing process technologies, there is a trend toward having various electronic products slimmer and slimmer in the market. To go with the trend, the electronic components of the electronic products are miniaturized, while the performances and operation capability of the electronic components are increased. When such as a notebook or a desktop computer operates, many electronic components generate high heat at the same time, especially the central processing unit (CPU). The heat must be efficiently dissipated outward. Otherwise, the temperature will rise very quickly to cause burnout of the electronic components. In order to avoid damage of the CPU, in general, a heat sink composed of a radiating fin assembly and a cooperative cooling fan is provided to dissipate the heat generated by the CPU and thus keep the CPU functioning normally. Therefore, the CPU heat sink has become a very important component in the current information industry.

Recently, water-cooling technology has been widely applied to personal computers to save the large volume radiating fin assembly. According to the water-cooling technology, the heat generated by the heat source of a system is absorbed by a working fluid. Then heat exchange takes place between the working fluid and the air under operation of a heat exchanger. The length of the pipeline is freely variable so that the heat exchanger (radiating fin assembly) can be more flexibly positioned without limitation of space. The water-cooling system necessitates a water reservoir and a pump for driving the working fluid to flow. Therefore, the entire system has the problems of reliability of the pump, leakage of the pipeline, etc. However, while being imperfect, the water-cooling heat dissipation technology is still the best option for heat management and control in the market. The water-cooling system is applicable to a desktop computer that has a larger volume and is free from limitation of space. However, the water-cooling technology can be hardly applied to a current lightweight and slim laptop. Therefore, at the present time, heat pipe and radiating fin assembly are still used in the laptop for heat transfer and heat exchange. Also, power consumption of the CPU of the laptop is required to be as lower as possible. Therefore, it is tried by the manufacturers to provide a heat dissipation measure with higher heat flux for satisfying the upcoming desperate heat dissipation demand.

In the conventional heat dissipation technology, heat pipe and vapor chamber (VC) are used as heat transfer components. When manufacturing the heat pipe and vapor chamber, the inner wall of the heat pipe is formed with a sintered body as a capillary structure. In the manufacturing process, metal (copper) particles or powders are filled into the inner wall and compacted. Then the heat pipe is fed into a sintering furnace to sinter the copper particles or powders into porous capillary structure for providing capillary attraction. The sintered body leads to a considerable thickness of the heat pipe and vapor chamber. As a result, it is impossible to slim the heat pipe and vapor chamber. In addition, the vapor chamber is formed with sintered wick, mesh or channel structure for providing capillary attraction to drive and circulate the working fluid in the heat pipe or vapor chamber. Such structure is manufactured in a quite complicated manner at higher cost.

Furthermore, it is critical to select a suitable wick structure for the vapor chamber. The wick structure must be able to keep the flow speed of the condensed liquid and have sufficient capillary attraction to overcome gravity. According to the aforesaid, the conventional heat pipe or vapor chamber has the following defects:

1. It is hard to process the conventional heat pipe or vapor chamber.
2. The conventional vapor chamber can be hardly slimmed.
3. The conventional heat pipe or vapor chamber is manufactured at higher cost.
4. It takes much time to manufacture the conventional heat pipe or vapor chamber.

SUMMARY OF THE INVENTION

A primary object of the present invention is to provide an improved thermal siphon structure, which is able to drive a working fluid to circulate and transfer heat without any capillary structure. The thermal siphon structure is simplified and manufactured at much lower cost A further object of the present invention is to provide the above thermal siphon structure, which is able to transfer heat at high efficiency.

To achieve the above and other objects, the thermal siphon structure of the present invention includes a main body, a chamber, an evaporation section, a condensation section and a connection section. The chamber is disposed in the main body. The evaporation section is arranged in the chamber on one side thereof. The evaporation section has multiple first flow guide sections. Each of the first flow guide sections has multiple first flow guide bodies. The first flow guide bodies are arranged at intervals to define therebetween at least one first flow way. The first flow way has a first narrower end and a first wider end. The first wider end of one first flow way corresponds to the first narrower end of another first flow way. The first flow way communicates with at least one free area. The condensation section is arranged in the chamber on the other side thereof opposite to the evaporation section. The condensation section has multiple second flow guide sections. Each of the second flow guide sections has multiple second flow guide bodies. The second flow guide bodies are arranged at intervals to define therebetween at least one second flow way. The second flow way has a second narrower end and a second wider end. The second wider end of one second flow way corresponds to the second narrower end of another second flow way. The connection section is arranged between the evaporation section and the condensation section in the chamber. The connection section has a set of first communication holes and a set of second communication holes in communication with the evaporation section and the condensation section respectively.

In the thermal siphon structure of the present invention, the first flow guide bodies define therebetween the first flow way in the chamber in contact with the heat source. Superheated steam is produced in the first flow way to provide high pressure necessary for driving the two-phase working fluid to circulate. A low-pressure end is designed in front of the condensation section for creating a pressure gradient for driving the vapor/water to circulate. Therefore, the thermal siphon structure of the present invention is able to drive the working fluid to circulate and transfer heat without any capillary structure. The thermal siphon structure is able to transfer heat at much higher efficiency and is manufactured at lower cost.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
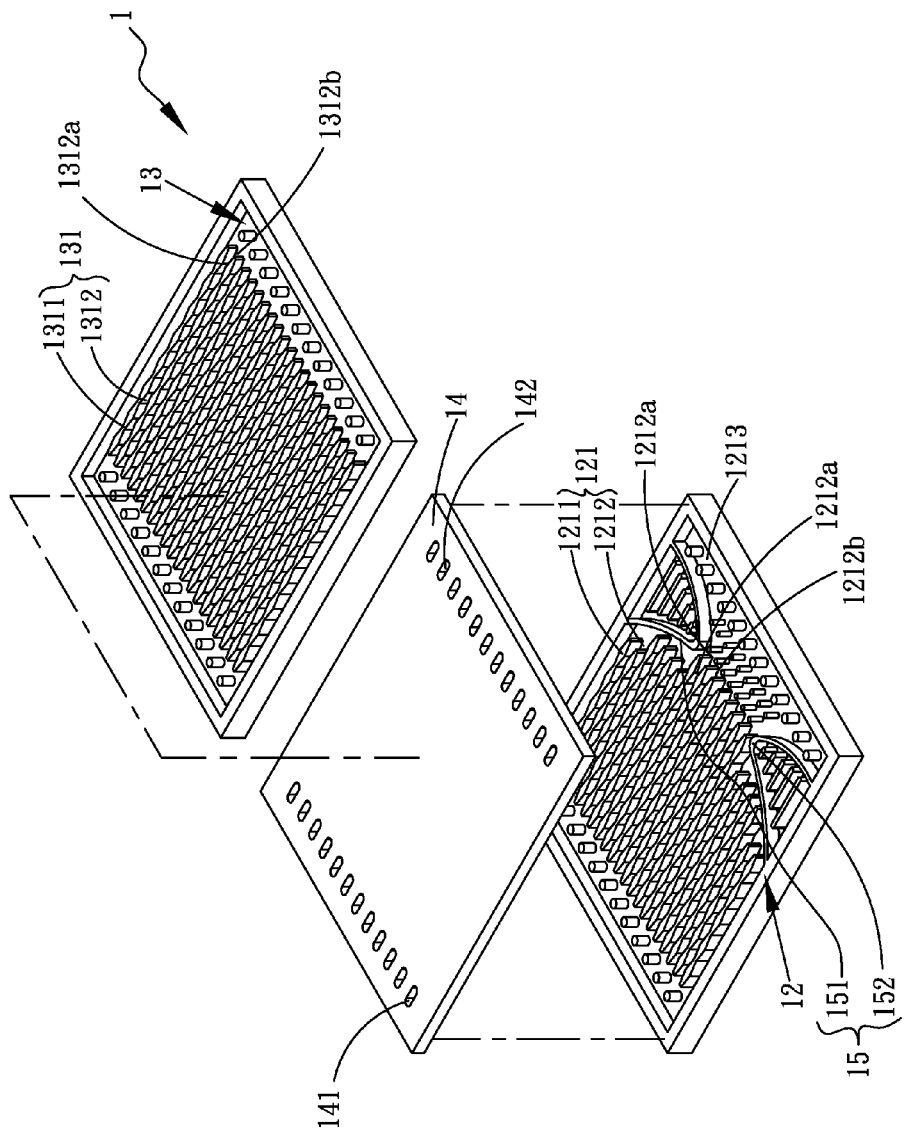
FIG. 1a is a perspective exploded view of a preferred embodiment of the thermal siphon structure of the present invention.
Figure 1B:
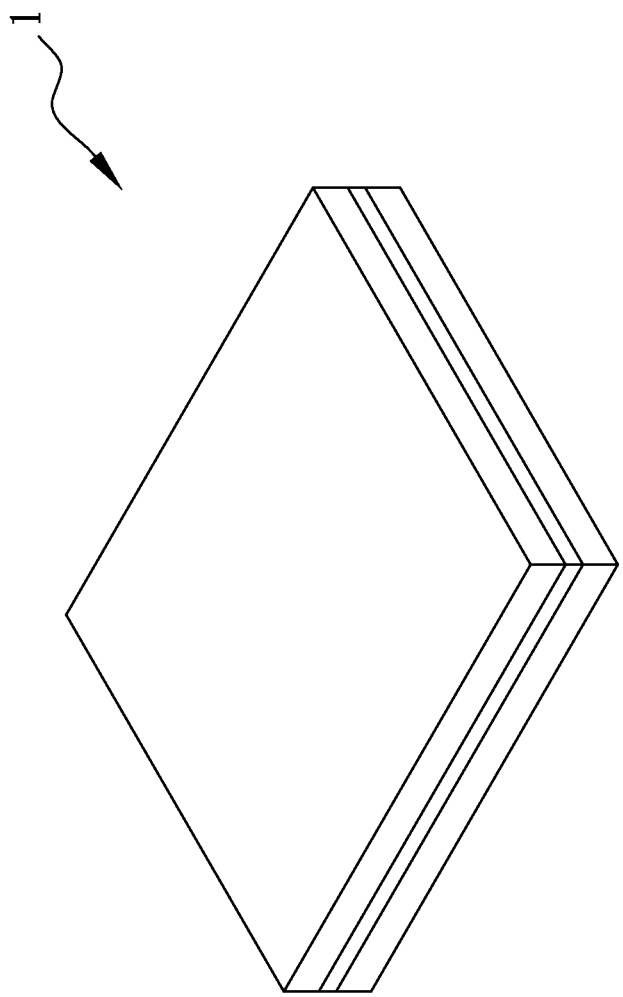
FIG. 1b is a perspective assembled view of the preferred embodiment of the thermal siphon structure of the present invention.
Figure 1C:
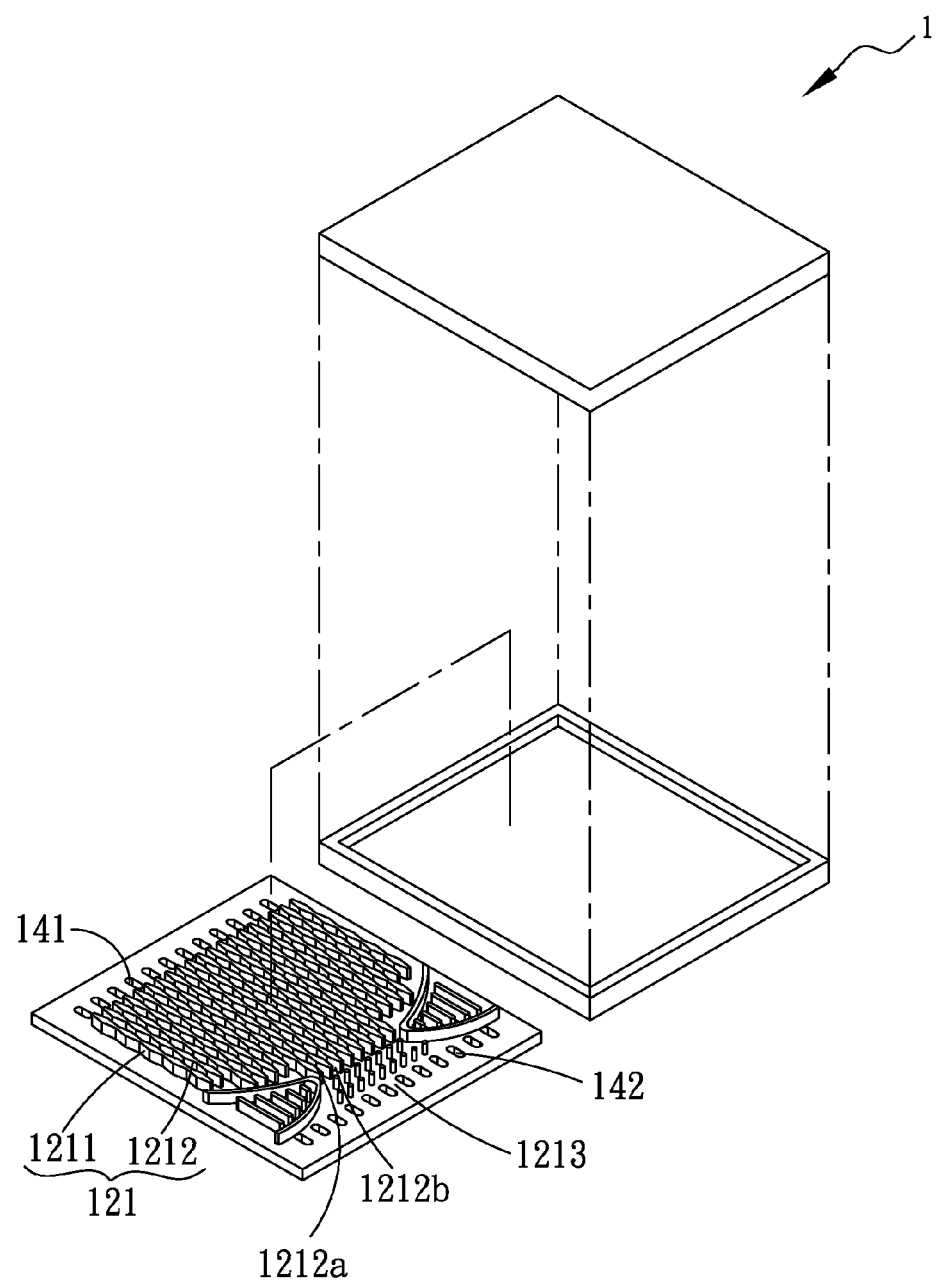
FIG. 1c is another perspective exploded view of the preferred embodiment of the thermal siphon structure of the present invention.
Figure 1D:
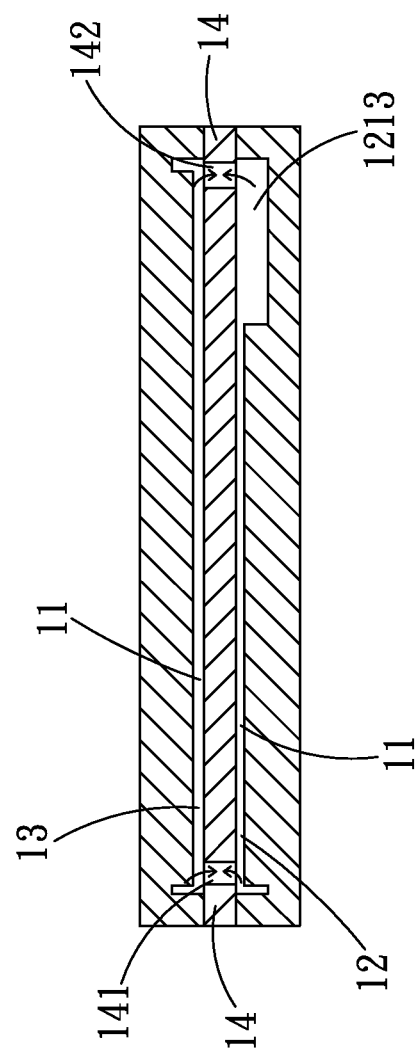
FIG. 1d is a sectional view of the preferred embodiment of the thermal siphon structure of the present invention.
Figure 1E:
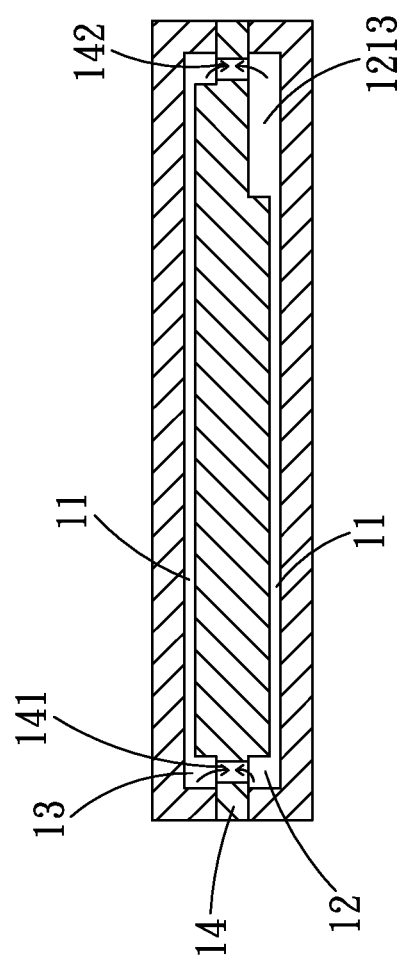
FIG. 1e is another sectional view of the preferred embodiment of the thermal siphon structure of the present invention.

Please refer to FIGS. 1a, 1b, 1c, 1d and 1e. FIG. 1a is a perspective exploded view of a preferred embodiment of the thermal siphon structure of the present invention. FIG. 1b is a perspective assembled view of the preferred embodiment of the thermal siphon structure of the present invention. FIG. 1c is another perspective exploded view of the preferred embodiment of the thermal siphon structure of the present invention. FIG. 1d is a sectional view of the preferred embodiment of the thermal siphon structure of the present invention. FIG. 1e is another sectional view of the preferred embodiment of the thermal siphon structure of the present invention. According to the preferred embodiment, the thermal siphon structure of the present invention includes a main body 1, a chamber 11, an evaporation section 12, a condensation section 13 and a connection section 14. The chamber 11 is disposed in the main body 1.

The evaporation section 12 is arranged in the chamber 11 on one side thereof. The evaporation section 12 has multiple first flow guide sections 121 and a guide section 15. Each of the first flow guide sections 121 has multiple first flow guide bodies 1211. The first flow guide bodies 1211 are transversely arranged at intervals and longitudinally continuously arranged. The first flow guide bodies 1211 define therebetween at least one first flow way 1212. The first flow way 1212 has a first narrower end 1212a and a first wider end 1212b. The first wider end 1212b of one first flow way 1212 corresponds to the first narrower end 1212a of another first flow way 1212. The first flow way 1212 communicates with at least one free area 1213. The guide section 15 has a first guide portion 151 and a second guide portion 152. The first guide portion 151 and the second guide portion 152 are generally V-shaped, located between the first flow guide bodies 1211 and the at least one open area 1213 and extended from the two opposite walls of the chamber 11 toward a center.

The condensation section 13 is arranged in the chamber 11 on the other side thereof opposite to the evaporation section 12. The condensation section 13 has multiple second flow guide sections 131. Each of the second flow guide sections 131 has multiple second flow guide bodies 1311. The second flow guide bodies 1311 are transversely arranged at intervals and longitudinally continuously arranged. The second flow guide bodies 1311 define therebetween at least one second flow way 1312. The second flow way 1312 has a second narrower end 1312a and a second wider end 1312b. The second wider end 1312b of one second flow way 1312 corresponds to the second narrower end 1312a of another second flow way 1312.

The connection section 14 is arranged between the evaporation section 12 and the condensation section 13 in the chamber 11. The connection section 14 has a set of first communication holes 141 and a set of second communication holes 142 in communication with the evaporation section 12 and the condensation section 13 respectively. The sets of first and second communication holes 141, 142 are oppositely positioned on two sides of the connection section 14.

Figure 2B:
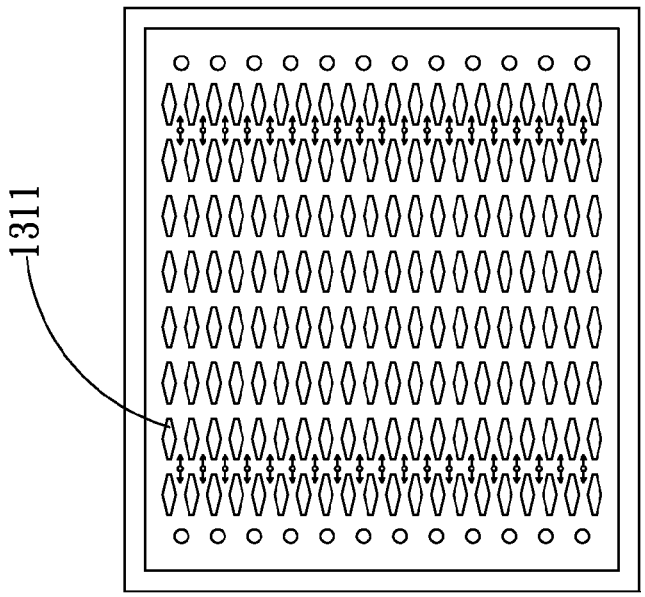
FIG. 2b is a bottom view of the condensation section of the second embodiment of the thermal siphon structure of the present invention.
Figure 2A:
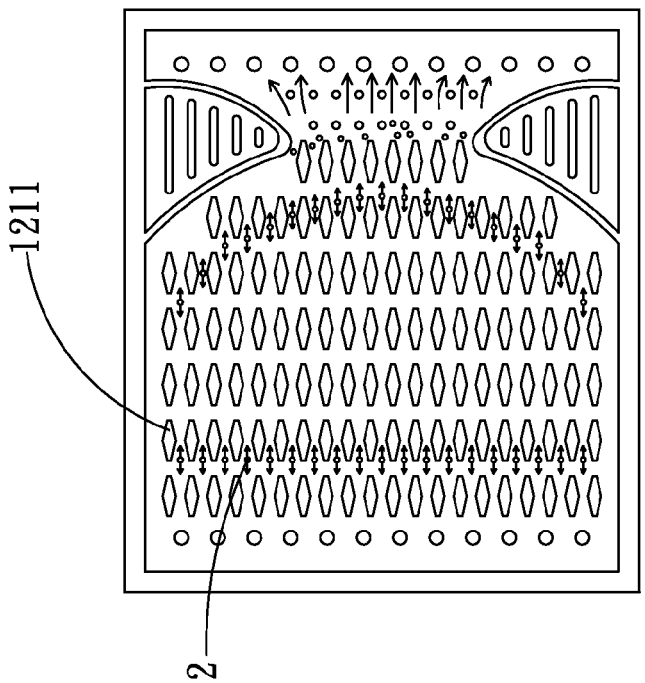
FIG. 2a is a top view of the evaporation section of a second embodiment of the thermal siphon structure of the present invention.

Please now refer to FIGS. 2a and 2b, which show a second embodiment of the thermal siphon structure of the present invention. The second embodiment is substantially identical to the first embodiment in structure and relationship between components and thus will not be repeatedly described. The second embodiment is only different from the first embodiment in that the first and second flow guide bodies 1211, 1311 are longitudinally discontinuously arranged.

Figure 3B:
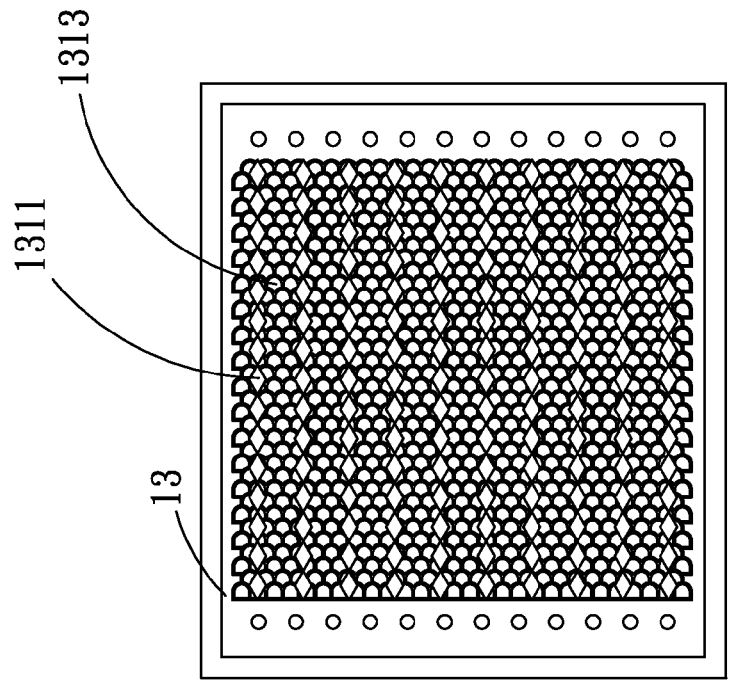
FIG. 3b is a bottom view of the condensation section of the third embodiment of the thermal siphon structure of the present invention.
Figure 3A:
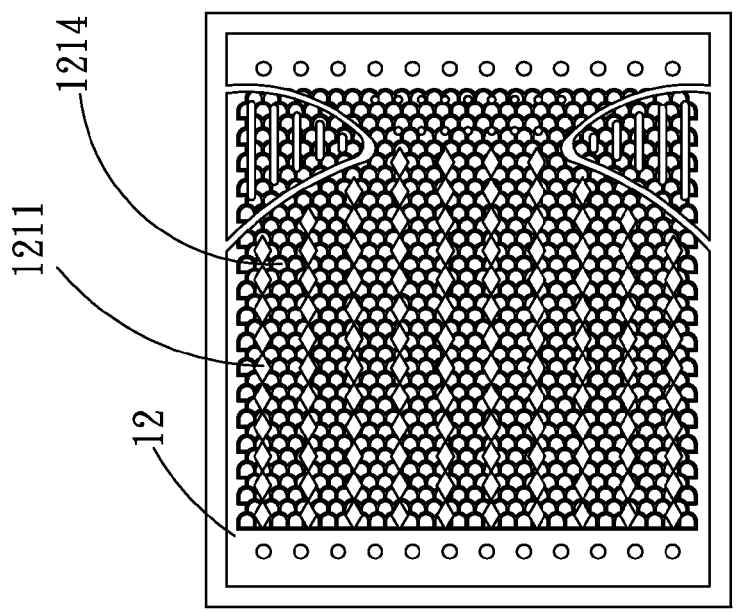
FIG. 3a is a top view of the evaporation section of a third embodiment of the thermal siphon structure of the present invention.

Please now refer to FIGS. 3a and 3b, which show a third embodiment of the thermal siphon structure of the present invention. The third embodiment is substantially identical to the first embodiment in structure and relationship between components and thus will not be repeatedly described. The third embodiment is only different from the first embodiment in that multiple pits 1214, 1313 are disposed between the first and second flow guide bodies 1211, 1311. The pits 1214, 1313 have the shape of a circle, a rectangle, a triangle, a fish scale or any other suitable geometric pattern. In this embodiment, the pits 1214, 1313 have, but not limited to, the shape of a fish scale for illustration purposes only.

Figure 4B:
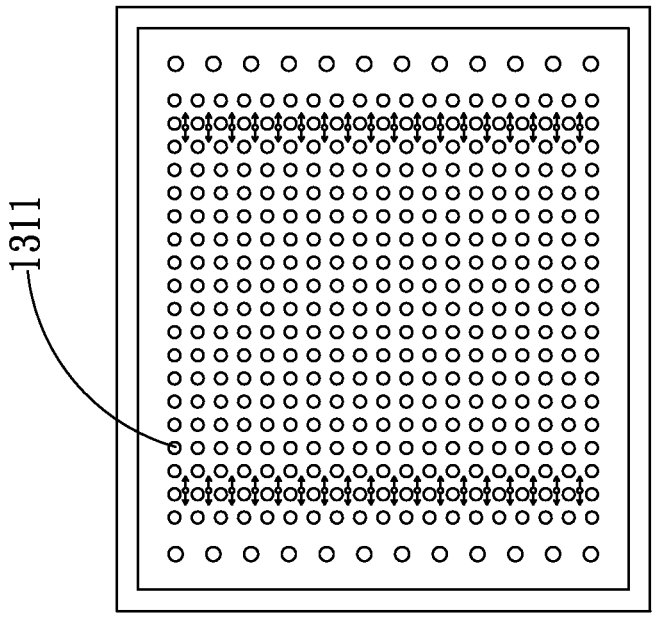
FIG. 4b is a bottom view of the condensation section of the second embodiment of the thermal siphon structure of the present invention in another aspect.
Figure 4A:
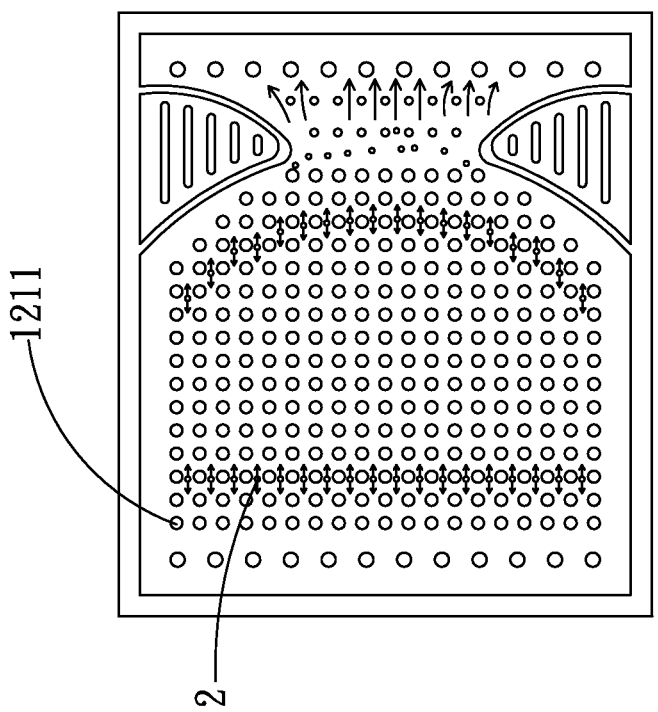
FIG. 4a is a top view of the evaporation section of the second embodiment of the thermal siphon structure of the present invention in another aspect.
Figure 5B:
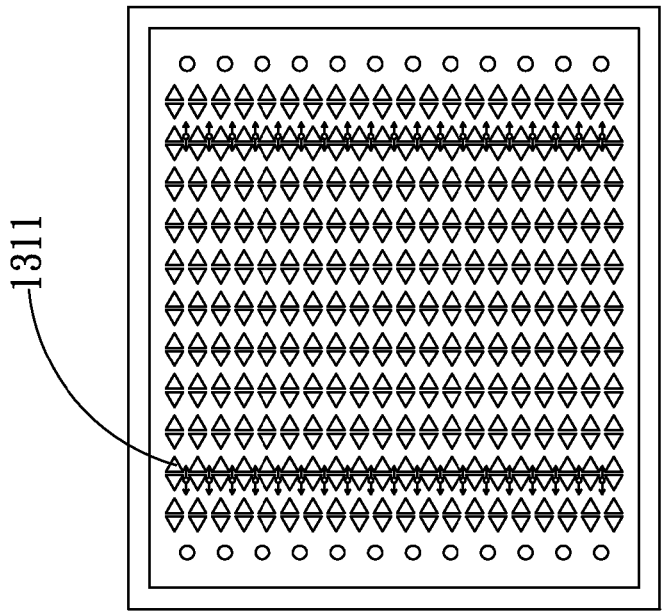
FIG. 5b is a bottom view of the condensation section of the second embodiment of the thermal siphon structure of the present invention in another aspect.
Figure 5A:
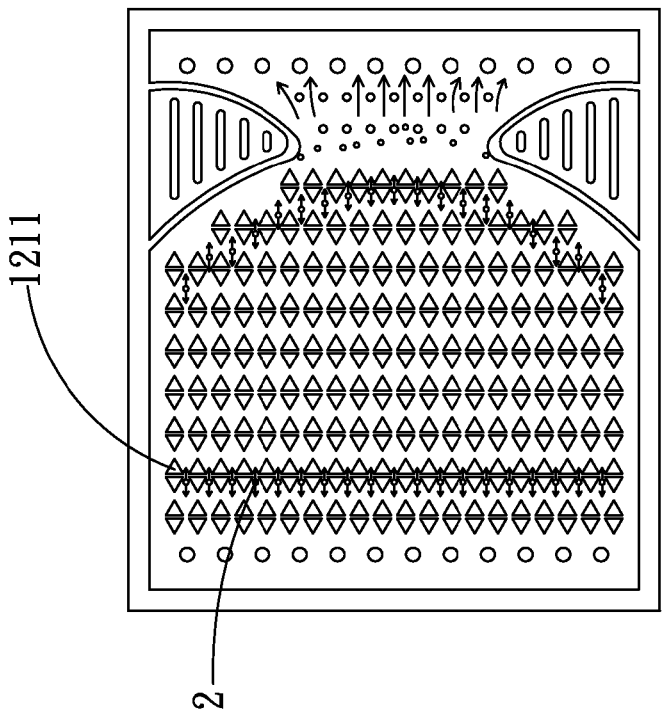
FIG. 5a is a top view of the evaporation section of the second embodiment of the thermal siphon structure of the present invention in another aspect.
Figure 6B:
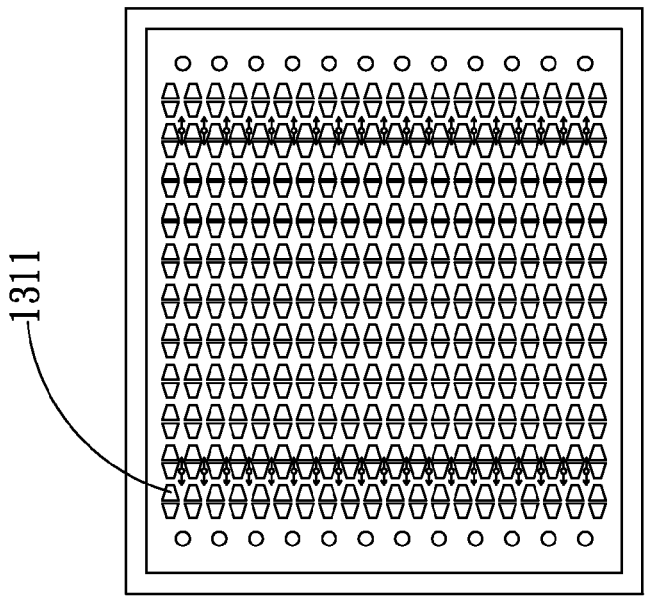
FIG. 6b is a bottom view of the condensation section of the second embodiment of the thermal siphon structure of the present invention in another aspect.
Figure 6A:
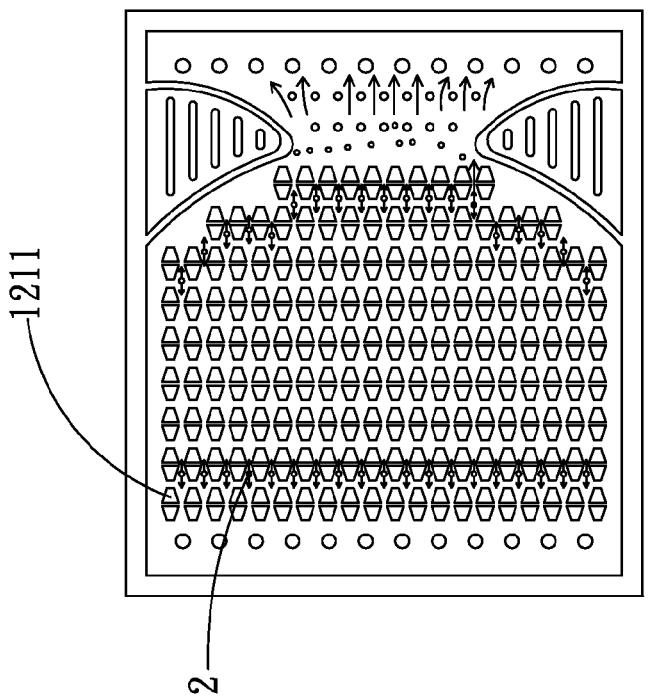
FIG. 6a is a top view of the evaporation section of the second embodiment of the thermal siphon structure of the present invention in another aspect.
Figure 7B:
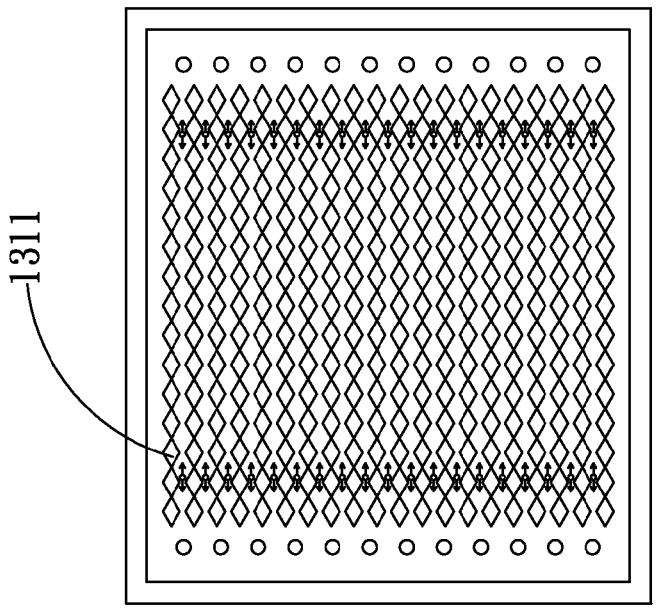
FIG. 7b is a bottom view of the condensation section of the second embodiment of the thermal siphon structure of the present invention in another aspect.
Figure 7A:
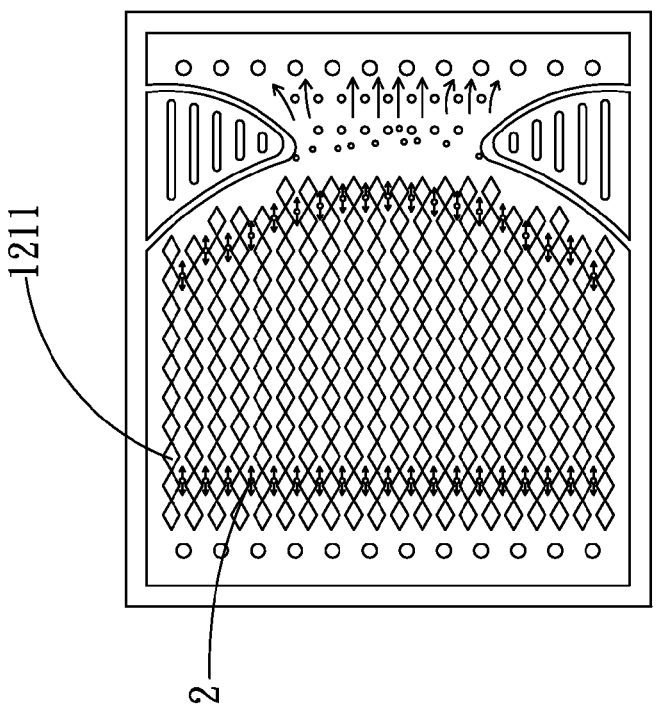
FIG. 7a is a top view of the evaporation section of the second embodiment of the thermal siphon structure of the present invention in another aspect.

In the first and second embodiments of the present invention, the first and second flow guide bodies 1211, 1311 can have the shape of a circle (as shown in FIGS. 4*a* and 4*b*), a triangle (as shown in FIGS. 5*a* and 5*b*), a trapezoid (as shown in FIGS. 6*a* and 6*b*), a rhombus (as shown in FIGS. 7*a* and 7*b*) or any other suitable geometric pattern.

Please now refer to FIGS. 1*a* to 7*b*. The first, second and third embodiments of the present invention provide a two-phase thermal siphon structure as a self-driven circulation cooling system. The working fluid is a coolant selected from the group consisting of pure water, methanol, acetone, R134A, etc. The chamber 11 of the thermal siphon structure is vacuumed so that the saturation temperature of the working fluid filled in the chamber 11 ranges from 20° C. to 30° C. After the vapor bubbles 2 collect in the evaporation section 12, the vapor bubbles 2 go through the free area 1213 to decrease the pressure and create a pressure gradient for driving the vapor/water to circulate. In addition, the condensation ratio of the vapor in the condensation section 13 abruptly rises to create a local negative pressure attraction to help in circulating the vapor/water.

Due to the pressure gradient, the condensed liquid working fluid is driven to circulate back to the evaporation section 12. Thanks to the high thermal convection coefficient during boiling and condensation, the heat spreading performance of the thermal siphon structure is greatly improved to lower heat resistance.

The heat generated by a heat generation component (not shown) is conducted to the surface of the evaporation section 12 of the main body 1 and then transferred to the first flow ways 1212 of the evaporation section 12 to boil and evaporate part of liquid. Then, by means of the buoyancy to the bubbles, the fluid is driven to the condensation section 13 to dissipate the heat. After condensed, due to gravity, the working fluid goes back to the evaporation section 12 in contact with the heat generation component (not shown) for absorbing heat and recycling.

Recently, many manufacturers have devoted a lot to water-cooling technology, especially the active water-cooling system, which necessitates a pump for driving the working fluid to circulate. As a result, the system is likely to encounter the problems of reliability of the valve of the pump and the lifetime of the pump. In contrast, the two-phase thermal siphon structure of the present invention provides a circulation cooling system without any additional pump or capillary structure. Therefore, the two-phase thermal siphon structure of the present invention is free from the problem of wearing of the component or the lifetime thereof. Moreover, the two-phase thermal siphon structure of the present invention is simplified and manufactured at lower cost to save energy and overcome the problem of noise.

The above embodiments are only used to illustrate the present invention, not intended to limit the scope thereof. It is understood that many changes and modifications of the above embodiments can be made without departing from the spirit of the present invention. The scope of the present invention is limited only by the appended claims.

What is claimed is:

1. A thermal siphon structure comprising:
   a main body;
   a chamber disposed in the main body;
   a lower layer comprising an evaporation section arranged in the chamber on one side thereof, the evaporation section having multiple spaced, continuous first flow guide sections, each of the first flow guide sections having multiple serially arranged first flow guide bodies, each of the first flow guide bodies being transversely arranged at spaced intervals to define between adjacent pairs of guide bodies a plurality of first flow ways, the first flow ways having a horizontal shape having a continuous series of sections, each having a first narrower end and a first wider end, the first wider end of each first flow way section corresponding to the first narrower end of another separate adjacent first flow way section, an end of each series of first flow ways communicating with at least one open area and a guide section comprising a pair of symmetrical opposed guide portions including a first guide portion and a second guide portion, wherein the first guide portion and the second guide portion are generally V-shaped structures, located between the first flow guide bodies and the at least one open area and extend from the two opposite walls of the chamber toward a center so as to form a narrowed necked opening between the evaporation sections and the open area, the guide portions containing a plurality of spaced members aligned parallel to the walls of the chamber;
   an upper layer comprising a condensation section arranged in the chamber on the other side thereof opposite to the evaporation section, the condensation section having multiple second flow guide sections, each of the second flow guide sections having multiple second flow guide bodies, the second flow guide bodies being transversely arranged at spaced intervals to define between adjacent pairs of guide bodies a plurality of second flow ways, the second flow ways having a series of sections each having a second narrower end and a second wider end, the second wider end of each second flow way section corresponding to the second narrower end of another adjacent second flow way section; and
   a connection section arranged between and separating said upper layer and said lower layer the evaporation section and the condensation section in the chamber, the connection section having a set of first communication holes and a set of second communication holes in communication with the evaporation section and the condensation section respectively.

2. The thermal siphon structure as claimed in claim 1, wherein the sets of first and second communication holes are oppositely positioned on two sides of the connection section.

3. The thermal siphon structure as claimed in claim 1, wherein the first flow guide bodies are longitudinally continuously arranged.

4. The thermal siphon structure as claimed in claim 1, wherein the first flow guide bodies are longitudinally discontinuously arranged.

5. The thermal siphon structure as claimed in claim 1, wherein the second flow guide bodies are longitudinally continuously arranged.

6. The thermal siphon structure as claimed in claim 1, wherein the second flow guide bodies are longitudinally discontinuously arranged.

7. The thermal siphon structure as claimed in claim 1, wherein multiple pits are disposed between the first and second flow guide bodies.

8. The thermal siphon structure as claimed in claim 7, wherein the pits have the shape of a circle, a rectangle, a triangle, a fish scale or any other suitable geometric pattern.

9. The thermal siphon structure as claimed in claim 1, wherein the first flow guide bodies have the shape of a circle, a triangle, a trapezoid, a rhombus or any other suitable geometric pattern.

10. The thermal siphon structure as claimed in claim 1, wherein the second flow guide bodies have the shape of a circle, a triangle, a trapezoid, a rhombus or any other suitable geometric pattern.

* * * * *